(12) United States Patent
Cummins et al.

(10) Patent No.: US 6,385,689 B1
(45) Date of Patent: May 7, 2002

(54) MEMORY AND A DATA PROCESSOR INCLUDING A MEMORY

(75) Inventors: Timothy J. Cummins, Cratloe; Dara Joseph Brannick, Claremorris, both of (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/020,088

(22) Filed: Feb. 6, 1998

(51) Int. Cl.[7] .............................................. G06F 13/00
(52) U.S. Cl. ......................................... 711/103; 712/37
(58) Field of Search ................................ 711/103, 105, 711/100; 365/201, 185.1, 185.02, 185.33, 238.5, 185.2; 712/37

(56) References Cited

U.S. PATENT DOCUMENTS

| | | |
|---|---|---|
| 4,272,760 A | 6/1981 | Prazak |
| 4,476,531 A | 10/1984 | Marino et al. |
| 5,111,425 A | 5/1992 | Takeuchi et al. |
| 5,212,795 A | 5/1993 | Hendry |
| 5,224,070 A | 6/1993 | Fandrich et al. ............. 365/185 |
| 5,242,848 A | 9/1993 | Yeh .............................. 437/43 |
| 5,313,618 A | 5/1994 | Pawloski |
| 5,375,218 A | 12/1994 | Umeda |
| 5,375,228 A | 12/1994 | Leary et al. |
| 5,390,317 A | 2/1995 | Weiss et al. |
| 5,426,769 A | 6/1995 | Pawloski |
| 5,467,200 A | 11/1995 | Ohsawa et al. |
| 5,483,239 A | 1/1996 | Arczynski et al. |
| 5,488,688 A | 1/1996 | Gonzales et al. |
| 5,504,684 A | 4/1996 | Lau et al. |
| 5,515,320 A * | 5/1996 | Miwa ........................ 365/185.1 |
| 5,535,357 A | 7/1996 | Moran et al. ................ 395/430 |
| 5,581,695 A | 12/1996 | Knoke et al. |
| 5,627,784 A | 5/1997 | Roohparvar ........... 365/189.01 |
| 5,630,164 A | 5/1997 | Williams et al. |
| 5,651,128 A | 7/1997 | Gaultier ........................ 395/430 |
| 5,752,077 A | 5/1998 | Yiu et al. |
| 5,758,059 A | 5/1998 | Alexander |
| 5,767,729 A * | 6/1998 | Song ............................ 327/390 |
| 5,768,194 A * | 6/1998 | Matsubara et al. ..... 365/185.33 |
| 5,781,750 A | 7/1998 | Blomgren et al. |
| 5,796,139 A | 8/1998 | Fukase ......................... 257/315 |
| 5,805,865 A | 9/1998 | Mimura et al. |
| 5,848,026 A * | 12/1998 | Ramamurthy et al. ... 365/238.5 |

(List continued on next page.)

FOREIGN PATENT DOCUMENTS

| | | |
|---|---|---|
| EP | 0 592 069 A1 | 4/1994 |
| EP | 0 757 356 A1 | 2/1997 |
| JP | 08 293566 | 11/1996 |
| WO | WO 97/303492 | 8/1997 |

OTHER PUBLICATIONS

Clinton Kuo et al., "A 512-kb EEPROM Embedded in a 32-b Microcontroller," *IEEE, Journal of Solid State Circuits*, vol. 27, No. 4, Apr. 1992, pp. 574–581.

Babb et al, "Logic Emulation with Virtual Wires", IEEE Trans on Computer–Aided Design of Int. Circuits pp. 609–626, Jun. 1997.

(List continued on next page.)

*Primary Examiner*—Matthew Kim
*Assistant Examiner*—Fred F. Tzeng
(74) *Attorney, Agent, or Firm*—Wolf, Greenfield & Sacks, P.C.

(57) ABSTRACT

A data processor is provided which has integrated therein at least two of a bootstrap memory, a program memory and a data memory, wherein the at least two memories are of the same construction. In an exemplary embodiment, the memories are flash EEPROM memories. The data memory is provided with registers for temporarily storing the contents of an entire row of memory such that modifications can be easily made to a single bit within the row by storing the contents of the row, erasing the row, modifying the data and storing the data back in the row.

25 Claims, 5 Drawing Sheets

U.S. PATENT DOCUMENTS

| | | | |
|---|---|---|---|
| 5,857,094 A | | 1/1999 | Nemirovsky |
| 5,862,073 A | | 1/1999 | Yeh et al. ............... 365/185.01 |
| 5,862,148 A | | 1/1999 | Typaldos et al. |
| 5,872,954 A | | 2/1999 | Matsushita |
| 5,873,112 A | * | 2/1999 | Norman ...................... 711/103 |
| 5,889,480 A | | 3/1999 | Kim |
| 5,898,862 A | | 4/1999 | Vajapey |
| 5,900,008 A | * | 5/1999 | Akao et al. .................. 711/100 |
| 5,901,330 A | * | 5/1999 | Sun et al. ...................... 710/8 |
| 5,937,423 A | * | 8/1999 | Robinson .................... 711/103 |
| 5,953,255 A | * | 9/1999 | Lee ........................ 365/185.2 |
| 5,954,813 A | | 9/1999 | Mann et al. |
| 5,956,277 A | * | 9/1999 | Roohparvar ................ 365/201 |
| 5,963,473 A | * | 10/1999 | Norman ................. 365/185.02 |
| 5,974,015 A | | 10/1999 | Iizuka et al. |
| 5,989,960 A | | 11/1999 | Fukase ....................... 438/267 |
| 6,009,496 A | * | 12/1999 | Tsai ........................... 711/103 |
| 6,012,109 A | | 1/2000 | Schultz |
| 6,016,555 A | | 1/2000 | Deao et al. |
| 6,023,522 A | | 2/2000 | Draganoff et al. |

OTHER PUBLICATIONS

Babb et al, "The RAW Benchmark Suite: Computation Structures for General Purpose Computing", Field–Programmable Custom Computing Machines, pp. 134–143, Apr. 1997.

Dahl et al, "Emulation of the SPARCLE Microprocessor with the MIT Virtual Wires Emulation System", for Custom Comp. Machines, pp. 14–22, Apr. 1994.

Motorola DSP56100 Technical Data, Section 10, On–Chip Emulation (OnCE).

Motorola Digital Signal Processor (DSP), Application Development System (ADS) User's Manual.

* cited by examiner

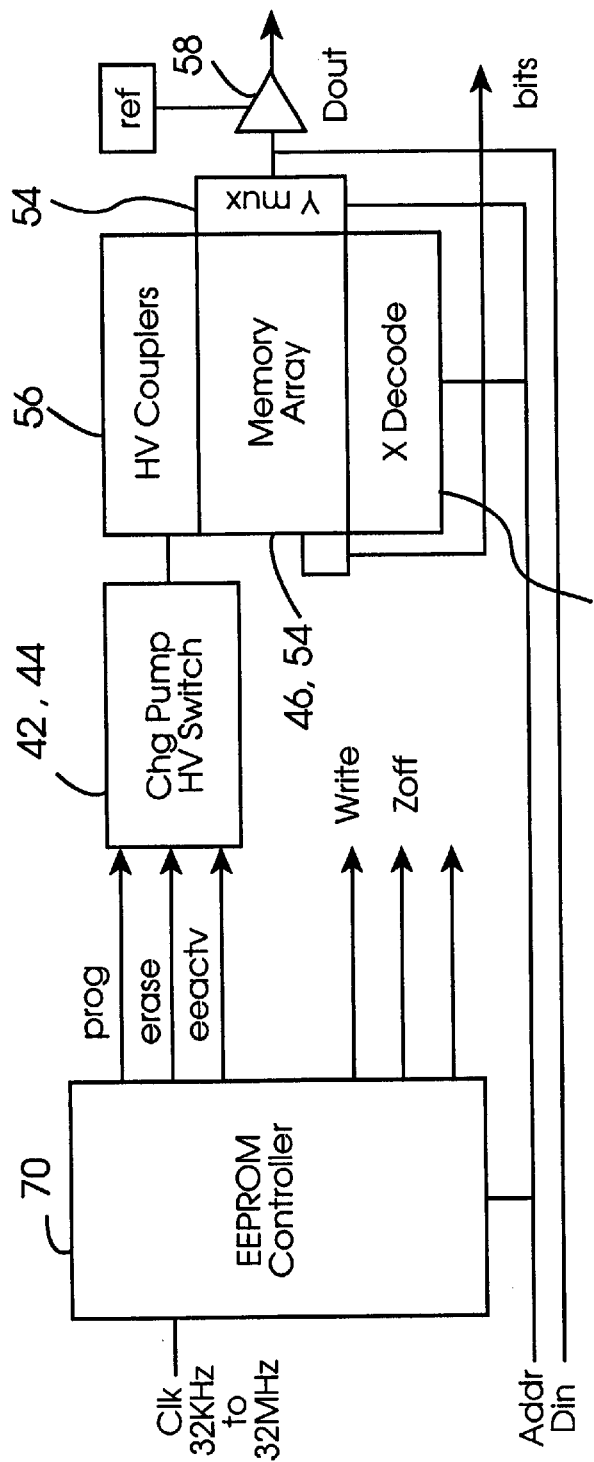
Fig. 5
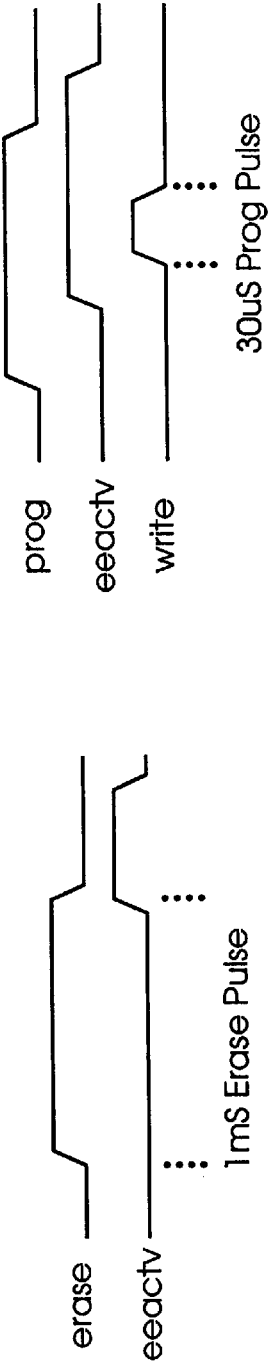
Fig. 6(a)
Fig. 6(b)

MEMORY AND A DATA PROCESSOR INCLUDING A MEMORY

TECHNICAL FIELD

The present invention relates to a memory and to a programmable data processor including such a memory.

BACKGROUND OF THE INVENTION

Data processors, such as microcontrollers typically include some or all of the following types of nonvolatile memory blocks:

Code memory—this is usually implemented in ROM, EPROM on in flash electrically erasable programmable read only memory (EEPROM). The term "flash" denotes that large blocks of memory are erasable simultaneously, since each cell is a single transistor.

User non-volatile data memory, usually two transistor EEPROM, thereby allowing single word (usually one byte) erase and programming.

Security—This is typically a separate block of memory bits which control access rights to the other blocks. Some levels of security allow the program code to be read back, but not to be erased or altered. Other levels of security inhibit reading of the program code as well.

Bootstrap memory—This is a "hidden" memory which usually does not appear on the data sheet and is not accessible by the user. The bootstrap memory includes code which is executed by the microcontroller as part of its power up sequence and also contains instructions for initialisation of registers, controlling emulation and data transfer, such as the instructions for down loading new program code. Bootstrap memory is usually implemented in Read only memory, ROM, and a significant disadvantage of this is that the instruction code is fabricated into the ROM during manufacture, thus making it very difficult to ensure that the code is correct during design of the data processor, and also meaning that changes in the code require the production of a new topography and consequently new masks are required to implement a change to just one byte of the bootstrap code.

The differing use requirements placed upon these various blocks of memory have caused manufacturers of devices such as microcontrollers, digital signal processors or other data processors to implement these different memories as physically different blocks. For example, the ROM bootstrap and EPROM program memory cannot easily be merged due to different cell sizes and layout, or one memory may be in low voltage read out while the other is simultaneously in a high voltage erase condition. Furthermore, since flash EEPROM is often the memory type of choice for code memory, the fact that large blocks of flash EEPROM are erased simultaneously makes this type of memory unsuitable for use as a non-volatile data memory since this inherently requires the ability to modify single bytes at a time.

The use of separate memory blocks does have a significant disadvantage in that space on the silicon is wasted in duplication of features common to each memory, such as address decoders, sense amplifiers, and in the case of EEPROM, charge pumps and high voltage circuitry for the erase and programming operations.

SUMMARY OF THE INVENTION

According to a first aspect of the present invention, there is provided a data processor comprising at least two reprogrammed non-volatile memories selected from a list comprising a bootstrap memory, a program memory and a data memory, wherein the at least two memories are of the same construction.

Preferably the memories are flash EEPROM. Flash EEPROM is a relatively compact memory type and the use of such a memory is an efficient use of space on the semiconductor used to form the integrated circuit. The memories may comprise an array of memory elements formed by split gate transistors having first, second and third terminals, the transistors being arranged in a matrix which advantageously has orthogonal axes, such as rows and columns such that the first terminals of transistors in a row are connected to a first shared conductor, and such that the second terminals of transistors in a column are connected to a second shared conductor.

Advantageously the rows of transistors are grouped into pairs with the third terminals of the transistors in the pair of rows being connected to a third shared conductor. Such an arrangement reduces the space required by the array of memory cells and associated addressing and controlling circuitry compared to a similar memory wherein the transistors are not grouped into pairs. Advantageously the first terminals are gate terminals, the second terminals are drain terminals and the third terminals are source terminals.

In the EEPROM memory, memory elements may be erasable by connecting the first shared conductor of a row to a first voltage and the second and third conductors to a second voltage less than the first voltage. For example, the gate electrode may be connected to a +15 volt supply whereas the drain and source may be connected to ground. Where the sources of transistors in paired rows are connected to a common node, the gate electrodes of the transistors in the paired rows are connected to the first voltage during an erase such that both rows in a pair are erased simultaneously. This ensures that disturbance between the rows is effectively eliminated.

Preferably the data processor further comprises a memory controller in association with a data memory arranged, when a row of the memory is to be updated, to read the contents of the entire row into a register such that the data stored in the row is held within the register when the row is erased. The contents of register can be altered and then the register can be used to reprogram the erased row. Advantageously the register is at least one byte wide and individual bytes within the register can be changed without changing any other byte. The data memory may also be implemented with paired rows of memory cells sharing a source node. In such an arrangement registers must be provided for each row in the pair.

Preferably the bootstrap memory is programmable. This alleviates the design problems associated with correctly writing the bootstrap code before mask fabrication for the data processor. It also enables code upgrades to be released should this be desirable, for example to cope with changes in associated components or technological upgrades.

Preferably the at least two memories share an address decoder. This reduces or alleviates the need to duplicate components such as address decoders, sense amplifiers and charge pumps. Advantageously the bootstrap memory is an allocated area within a larger memory block, the remainder of the block being used as a program memory.

Preferably the data processor further comprises a memory controller. The memory controller handles the sequences of events necessary to erase or program the memory. Advantageously the memory controller is implemented as a state machine which is responsive to a system clock. Thus the operations of the state machine may be synchronised to the system clock.

Preferably the state machine is arranged to control the switch on and switch off times of an erase pulse which is supplied to the gates of selected rows of transistors in order to erase the rows. The state machine may include at least one programmable register for controlling the commencement of and duration of the erase pulse.

Advantageously the state machine controls the duration of a first write pulse applied to the gate of a selected transistor during the writing of a memory cell. The state machine may also control the duration of a second write pulse applied to the source of a selected transistor during the writing of a memory cell. The state machine may include one or more programmable registers for adjustably controlling the commencement and duration of the first and/or second pulse.

Advantageously the data processor is placed into an idle mode before the state machine commences control of a memory erase or write operation. The data processor returns from its idle mode after the state machine has completed its erase or write operations. The data processor can predict the time (i.e. the number of clock cycles) for the state machine to complete an erase or write sequence. The data processor enters the idle mode for at least the number of clock cycles required by the state machine and, once that number of clock cycles have occurred, returns from the idle mode to resume its tasks.

Preferably the data processor has a non-volatile data memory implemented as an M by N array of memory cells, where M and N are positive integers with N being less than M. Advantageously N is an integer number of bytes. Advantageously registers are provided to buffer data from the data memory. In a preferred embodiment the data memory is four bytes wide and four eight bit registers are provided for holding data read from a selected one of the M rows of the data memory while the bytes within that row are modified by a modification process comprising a erase operation followed by a write operation.

According to a second aspect of the present invention, there is provided data processor having a non-volatile data memory implemented as an M by N array of EEPROM memory cells, where M and N are positive integers with N being less than M.

According to a third aspect of the present invention, there is provided a memory for a programable data processor, wherein the memory is a flash EEPROM comprising a plurality of memory cells arranged in an array with a common address decoder, and wherein the cells are further arranged into a plurality of groups and wherein members of a group are erasable whilst memory cells in the at least one other group retain their data.

According to a fourth aspect of the present invention there is provided a data processor having an erasable and programmable bootstrap memory included therein.

According to a fife aspect of the present invention there is provided a data processor including a memory controller synchronised to a data processor clock for controlling erase and write operations to an EEPROM.

According to a sixth aspect of the present invention there is provided a memory controller integrated with a data processor and arranged to operate from a clock common to the memory controller and a processing core of the data processor.

BRIEF DESCRIPTION OF THE DRAWINGS

The present invention will now be described, by way of example only, with reference to the accompanying drawings, in which:

FIG. 5 schematically illustrates the connections between the EEPROM controller and the memory array;

FIGS. 6a and 6b are simplified timing diagrams for an erase and a write operation, respectively;

DESCRIPTION OF A PREFERRED EMBODIMENT

Figure 1:
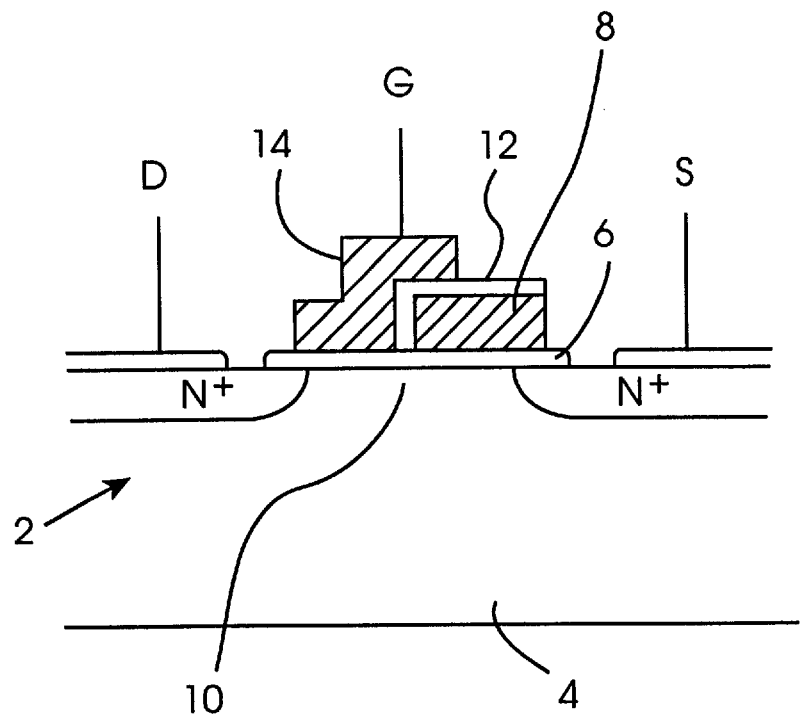
FIG. 1 is a schematic view of a memory cell of a flash EEPROM.

U.S. Pat. No. 5,242,848 describes a floating gate memory cell and a method for making such a cell. The memory cell described therein is of the type used in the preferred embodiment of the present invention and the teachings of U.S. Pat. No. 5,242,848 are incorporated herein by reference. Briefly, each memory cell, as shown in FIG. 1, comprises a field effect transistor 2 having a drain D and a source S formed by N-type doping of a P-type silicon substrate 4. An insulating layer 6, for example silicon dioxide is deposited over the substrate, and a polysilicon floating gate 8 is formed over a portion of a channel region 10 of the transistor. The floating gate 8 is offset to one side of the channel 10. An insulating layer 12 is then deposited over the floating gate 8 and then a second gate electrode 14 is fabricated. The gate connection G is made to this second electrode. The dimensions of the memory cell must be chosen such that electrons emanating from the source region can be injected onto the floating gate 8. Furthermore, charges must be removable from the floating gate 8 by a tunnelling mechanism to the control gate.

Figure 3A:
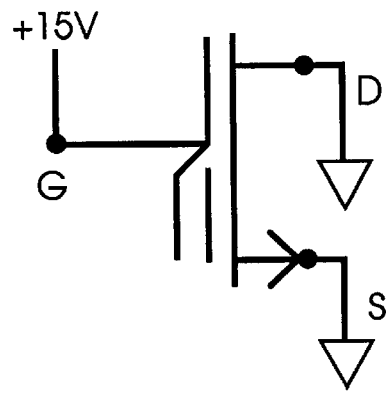
FIGS. 3a, 3b and 3c show the electrical conditions for erasing, writing and reading a memory cell, respectively.

In order to erase memory cells of this type, the drain D and source S regions are connected to ground and the gate electrode taken to a relatively high voltage, say around +15 volts, as shown in FIG. 3a In the memory described in U.S. Pat. No. 5,242,848, all the cells have a common source. The gate terminals are attached to the row lines and the drain terminals are attached to the column lines. Thus the memory is arranged such that the minimum erase size is one row, and the number of rows that are erased is controlled by the row address decoder. In the erased state the transistors are conducting.

Figure 2:
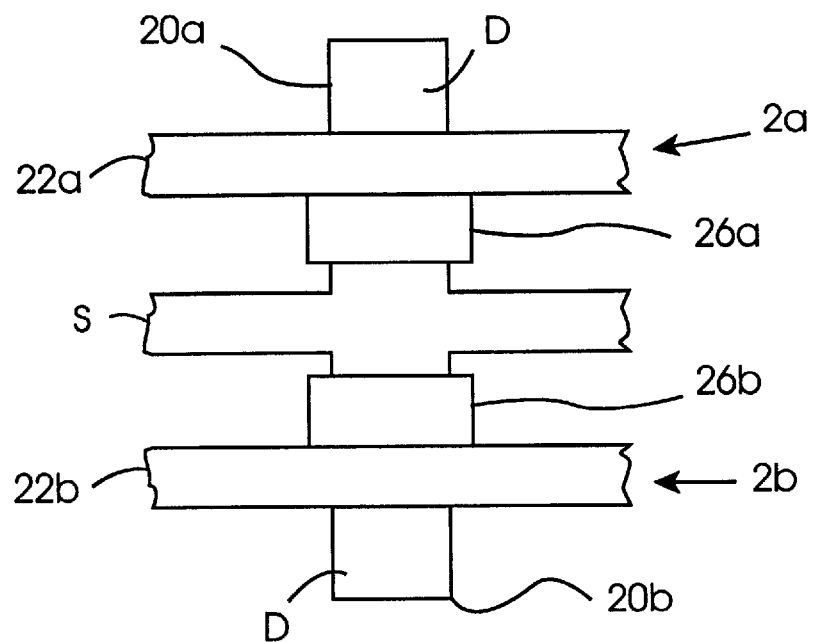
FIG. 2 is a plan view of memory cells in a single column and in adjacent rows sharing a common source.

The physical space occupied by the memory can be reduced if adjacent rows of memory share a common source conductor. As shown in FIG. 2 adjacent transistors 2a and 2b have respective drain connections 20a and 20b but share a source conductors. Each transistor has a respective gate electrode 22a and 22b. The floating gate structures are diagrammatically represented as areas 26a and 26b. Each row can be erased and written independently, but the other row of the pair would see a "disturb", i.e, a voltage transient outside of the normal supply rail voltage (0 and Vcc) which could affect the longevity of the data retention period. If only one of the rows was repeatedly erased and rewritten the accumulation of disturb pulses could cause the data in the other row to become corrupted. The user might then perceive the device as being faulty even though it is actually still working correctly. This potential problem is overcome by configuring a memory controller to cause both rows of the pair to be erased simultaneously, thereby giving a minimum erase sector of two rows. Thus during an erase cycle, the shared source S and the respective drains 20a and 20b are connected to ground, and the respective gate electrodes are supplied with an erase voltage of, typically 15 volts. The erase voltage is generated by charge pumps fabricated with the memory and under the control of the EEPROM controller.

Figure 3B:
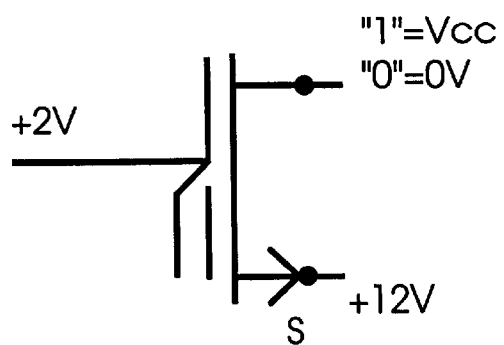

The memory cells are individually programmable, although care must be taken to ensure that the voltages on the drain terminals of cells which are not to be programmed but are in the same row as a cell selected for programming are high (Vcc), otherwise they could be inadvertently programmed. FIG. 3b schematically illustrates the write condition of the memory cells. In order to write to a cell, thereby changing the field effect transistor form a conducting state to a non conducting state, the gate terminal connected to a voltage at approximately midway between the nominal voltages for logic 1 and logic 0, typically around 2 volts, the drains of memory cells which are not to be programmed are connected to Vcc, whereas those transistors that are to be written and changed from the erased state have their drains connected to ground, thereby switching the transistor to a non-conducting state during the program cycle when the source is connected to a high (+12 volt) voltage. This results in the flow of a programming current and the occasional generation of hot electrons, some of which are injected onto the floating gate, thereby turning the transistor off.

Figure 3C:
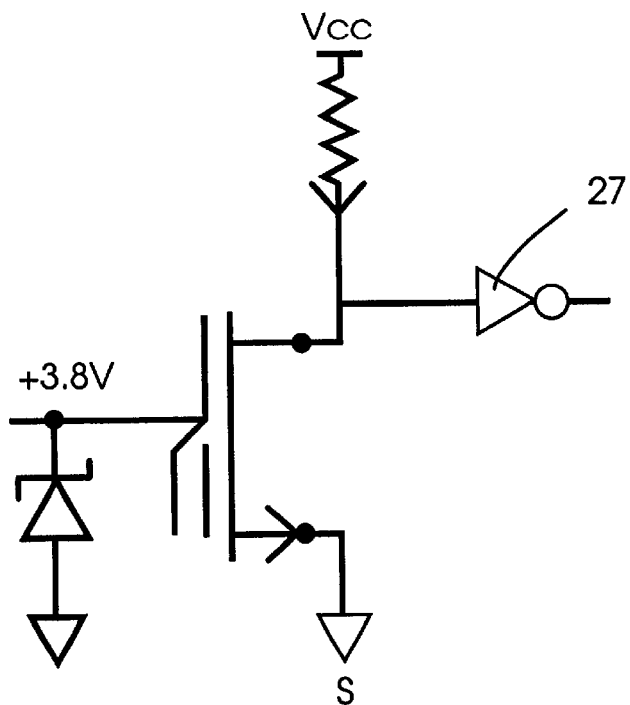

In order to read a memory cell, as shown in FIG. 3c, the address decoder sets the appropriate row line up to a voltage of approximately 3.8 Volts and the appropriate column line is connected to an input of a sense amplifier 27 which sees only a small voltage at the drain if the transistor is conducting, corresponding to logic 0, or a voltage exceeding a threshold voltage if the transistor is switched off or only weakly conducting, this corresponding to a logic 1 state. The sense amplifier has an inverting output so that an erased cell is seen to be in the logic 1 state, which is an industry standard configuration.

Figure 4:
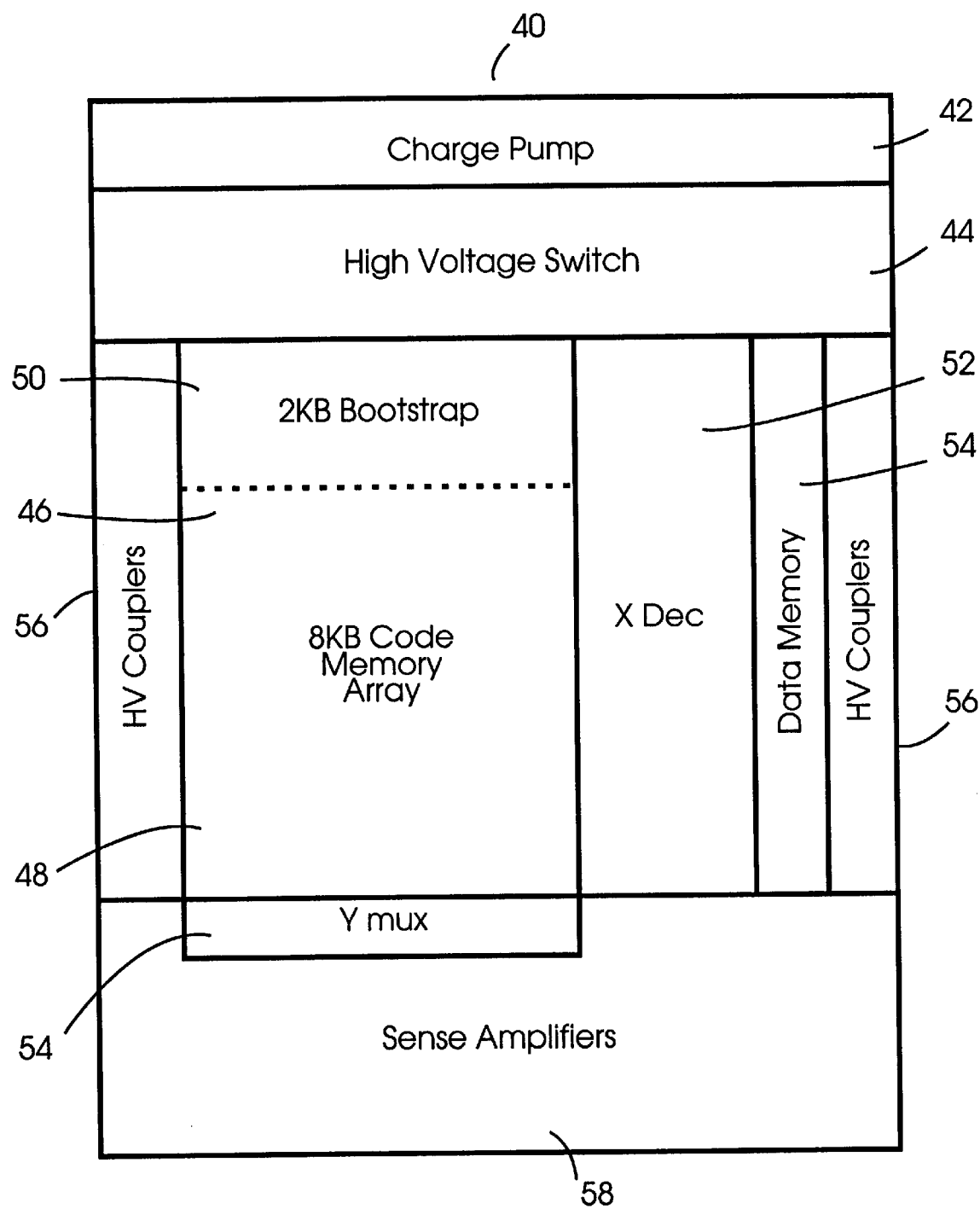
FIG. 4 schematically illustrates the layout of factional areas within a memory block constituting an embodiment of the present invention.

FIG. 4 schematically shows the layout of a memory segment which itself in formed as an integral part of a data processor, such as a micro controller, a digital signal processor or some other data processing engine. The memory segment 40 comprises a charge pump 42 for generating a controllable +12 to +15 volt supply from the +5 volts supply rail of the data processor and for supplying this voltage via high voltage switches 44 to a memory array 46 which is subdivided into a code memory area 48 and a Bootstrap memory 50. With this arrangement only one charge pump is required for the three different memory blocks. The on chip code memory occupies the lower 8 KB of memory space. In a 64 KB system, the area from 8 to 64 KB would be external addressable user memory. The Bootstrap memory occupies 2 KB above the 8 KB code memory but is hidden from the user and in effect on a different page of memory address space. The Bootstrap memory contains code relevant to the internal workings of the data processor, such as instructions for downloading data into the code array and for performing an initialisation sequence.

The address decoder is split into a X address decoder 52 controlling the row lines within the memory array and a Y address multiplexer 54 controlling the column lines within the array. The Y address multiplexer is arranged to enable eight columns of memory at a time in order to address all eight bits of a single byte word. The X address decoder is positioned intermediate the memory array 46 and 54. The fact that the arrays cannot logically be used at the same time allows the address decoder to be shared between them. This is because the microcontroller can only access one memory at a time. The memory blocks 54, 58 and 50 perform different tasks, have different access control rights but share the same architecture and address decoder. This represents a considerable saving in space on the silicon substrate. High voltage couplers 56 are provided on either side of the memory segment 40 for controlling connection of the high voltages to the gate connections and/or source connections (both of which run in the row direction) of the transistors forming the memory cells. A plurality of sense amplifiers for reading the contents of the memory cells and for providing a buffered output are provided in region 58.

The reading of the memory is directly under the control of the data processing core of the data processor incorporating the memory block 40. However, due to the necessity to provide high voltages for erase and write operations, these actions are controlled by a dedicated EEPROM controller which is implemented as a state machine. The interconnection between the EEPROM controller 70 and the memory block 40 is schematically illustrated in FIG. 5. EEPROM controllers are not new, but hitherto have typically been provided as asynchronous controllers, usually controlled by a ring oscillator based state machine. The data processing core has had to continuously poll a "busy" flag in the EEPROM controller to know when the erase or write cycle has finished in order to allow the core to resume normal program execution. The instructions to poll the busy bit have been stored in the bootstrap memory. The integration of the bootstrap and code memories into a single array mean that the instruction sequence for performing the poll of the "busy" bit is no longer available to the data processing core as in order to read the bootstrap memory it would become exposed to the erase/write voltages. However, by integrating the core and EEPROM controller onto the same chip and having them clocked by a common clock the EEPROM controller becomes synchronous with the data processing core. This means that the length of the erase/write cycles become predictable and consequently the core can be made to wait for the required time for the EEPROM controller to finish. Thus the core resumes executing the routine stored in the bootstrap memory exactly where it left off there by eliminating the need to perform polling operations and pushing and popping of register contents onto and from the stack.

The EEPROM controller has a plurality of output signals which are used to control the charge pump and the connections to the gate and source electrodes. The "erase" signal is sufficient to initiate an erase sequence in its own right, as shown in FIG. 6a. An erase operation is initiated by exerting the erase signal and is terminated by setting the eeacty signal which causes the charge pumps to be discharged, and also activates, for a short period, clamp transistors to ensure that the various signal lines and control lines within the memory are returned to ground.

In a write cycle, as shown in FIG. 6b, the "prog" line is asserted in order to initiate the charge pump. It takes time for the charges to build, and so "eeactv" is used to control the high voltage switch to connect the pump to the high voltage couplers and then in combination with the address decoders 52 and 54 to the sources of the required memory cells. Then the "write" signal is asserted which places eight data signals (for one byte) on the selected column lines in order to allow the memory cells to be written to. Internal registers within the EEPROM controller are provided to control the duration and relative start times of "erase", "eeactv" and "write" signals. These times can be changed if necessary in order adapt the write sequence for minimum write time, maximum retention or to compensate for aging of the device or operation in extremes of temperature, where tailoring of the erase or write sequence may be of some advantage. Once the write pulse has finished, the "prog" signal is reset, thereby turning off the charge pumps and a little later the falling edge of the "eeactv" signal is used to operate the clamp transistors briefly to ensure that all the lines within the memory are discharged and returned to ground.

Figure 7:
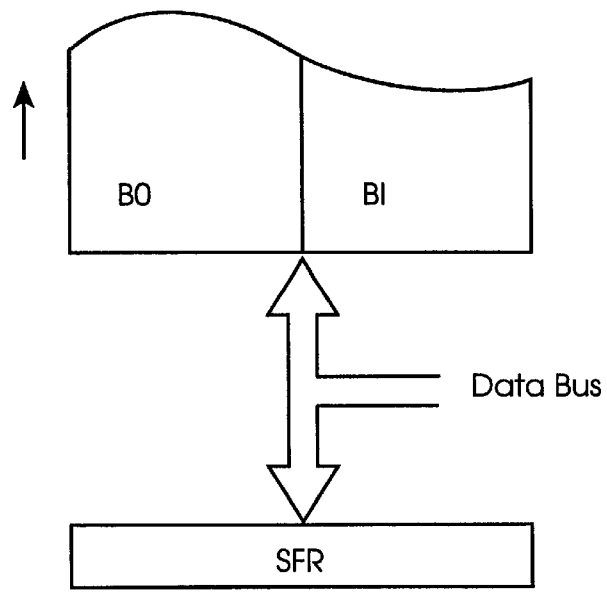
FIG. 7 schematically illustrates the relationship between the non-volatile data memory and the associated register.

The non-volatile data memory is provided as thin array, in the sense that the rows only correspond to a relatively small number of bits. The memory could be fabricated only one byte wide, thereby forming a true EEPROM. However in a preferred embodiment (FIG. 7) the data memory is two bytes wide B0 an B1 and four special purpose registers SFR are provided so that two entire rows of data (because rows of memory are paired by virtue of having a common source connection) may be loaded into the registers and then one or more bytes of a row may be modified. The EEPROM controller then erases the pair of rows and then writes the contents of the registers back into the rows, there by giving the ability to simulate true EEPROM functionality within a flash EEPROM architecture.

Figure 8:
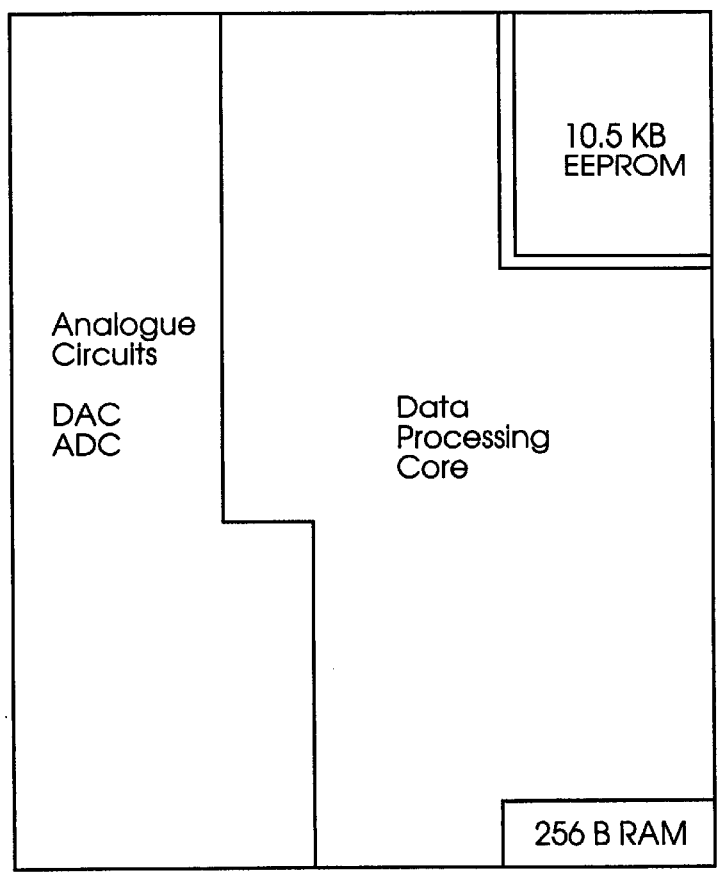
FIG. 8 schematically illustrates the layout of a data processor constituting an embodiment of the present invention, and showing the relative sizes of memory types.

FIG. 8 Schematically illustrates the layout of the data processor having a memory segment including a 10.5 kilobyte EEPROM of the type illustrated in FIG. 4. It should be noted that the 10.5 kilobyte EEPROM block only occupies about three times the space of 256 bytes of RAM. Thus the level of space saving by integrating the various different memory functions of code memory, bootstrap memory and non-volatile data memory within a single EEPROM block results in a significant space saving on the silicon.

It is thus possible to integrate a plurality different memory types within a single memory architecture. This provides a space saving by avoiding the duplication of address decoders, sense amplifiers and charge pumps. Furthermore, by limiting the memory architecture to a single type, fabrication complexity is reduced as the memory type used herein and described in U.S. Pat. No. 5,242,848 carries only a modest processing overhead over formation of CMOS transistors. The integration of the EEPROM controller within the data processor and its interaction with the processor core by means of the idle condition and clock counting to determine when the EEPROM controller has finished erasing or writing memory enables the integration of bootstrap and code memory into a single physical memory array and also provides a simple and robust control scheme between the EEPROM controller and the data processing core.

Thus the code memory 48, the data memory 54 and even the bootstrap memory 50 can be modified/rewritten.

What is claimed is:

1. A data processor comprising at least two reprogrammed non-volatile memories selected from a list comprising a boot strap memory, a program memory and a data memory, wherein the at least two memories are of the same construction and in which the data processor further comprises a memory controller implemented as a state machine and in which the data processor is placed into an idle mode before the state machine commences control of a memory erase or write operation.

2. A data processor as claimed in claim 1 wherein the memories are flash EEPROM.

3. A data processor as claimed in claim 2 wherein the memories comprise an array of memory elements formed by split gate transistors having first, second and third terminals, the transistors arranged in rows and columns such that the first terminals of transistors in a row are connected to a first shared conductor, and such that the second terminals of transistors in a column are connected to a second shared conductor.

4. A data processor as claimed in claim 3, in which the rows of transistors are grouped into pairs with the third terminals of the transistors in the pair of rows being connected to a third shared conductor.

5. A data processor as claimed in claim 3, in which the first terminals are gate terminals, the second terminals are drain terminals and the third terminals are source terminals.

6. A data processor as claimed in claim 5, in which memory elements are erasable by connecting the first shared conductor of a row to a first voltage and the second and third conductors to a second voltage less than the first voltage.

7. A data processor as claimed in claim 6, in which the first shared conductors of adjacent rows which share the third shared conductor are arranged to be connected to the first voltage during an erase such that both rows in a pair are erased simultaneously.

8. A data processor as claimed in claim 6, further comprising a memory controller in association with a data memory and arranged, when a row of the memory is to be updated to read the contents of the entire row into a register such that the data stored in the row is held within the register when the row is erased.

9. A data processor as claimed in claim 8, in which the contents of register can be altered and then the register is used to reprogram the erased row.

10. A data processor as claimed in claim 9, in which the register is at least one byte wide and individual bytes within the register can be changed without changing any other byte.

11. A data processor as claimed in claim 1, wherein one of the memories is a bootstrap memory and the bootstrap memory is programmable.

12. A data processor as claimed in claim 11 in which the bootstrap memory is an allocated area within a larger memory block, the remainder of the block being used as a program memory.

13. A data processor as claimed in claim 1, in which the at least two memories share an address decoder.

14. A data processor as claimed in claim 1, in which the state machine is responsive to a system clock.

15. A data processor as claimed in claim 14, in which the operations of the state machine are synchronised to the system clock.

16. A data processor as claimed in claim 1, in which the state machine controls the switch on and switch off times of an erase pulse which is supplied to the gates of selected rows of transistors in order to erase the rows.

17. A data processor as claimed in claim 16, in which the state machine has a programmable register for controlling the duration of the erase pulse.

18. A data processor as claimed in claim 1, in which the state machine controls the duration of a first write pulse applied to the gate of a selected transistor during the writing of a memory cell.

19. A data processor as claimed in claim 18, in which the state machine contains a programmable register for adjustably controlling the duration of the first pulse.

20. A data processor as claimed in claim 19 in which the state machine contains a programmable register for adjustably controlling the start time of the first write pulse relative to a timing signal.

21. A data processor as claimed in claim 1, in which the state machine controls the duration of a second write pulse applied to the source of a selected transistor during the writing of a memory cell.

22. A data processor as claimed in claim 21, in which the state machine contains a programmable register for adjustably controlling the duration of the second pulse.

23. A data processor as claimed in claim 22 in which the state machine contains a programmable register for adjustably controlling the start time of the second write pulse relative to a timing signal.

24. A data processor as claimed in claim 1, in which the data processor is returned from its idle mode after the state machine has completed one of its erase and write operations.

25. A data processor as claimed in claim 24, in which the state machine is clocked by a clock, and the number of clock cycles for a predetermined operation is known, and in which on entering the idle mode a data processing core of the data processor counts clock cycles to determine when the state machine has finished a memory modifications operation and then exits from the idle mode.

* * * * *